(12) United States Patent
Chen et al.

(10) Patent No.: US 7,192,494 B2
(45) Date of Patent: *Mar. 20, 2007

(54) METHOD AND APPARATUS FOR ANNEALING COPPER FILMS

(75) Inventors: B. Michelle Chen, San Jose, CA (US); Ho Seon Shin, Mountain View, CA (US); Yezdi Dordi, Palo Alto, CA (US); Ratson Morad, Palo Alto, CA (US); Robin Cheung, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 240 days.

This patent is subject to a terminal disclaimer.

(21) Appl. No.: 10/611,589

(22) Filed: Jun. 30, 2003

(65) Prior Publication Data

US 2004/0003873 A1 Jan. 8, 2004

Related U.S. Application Data

(60) Division of application No. 09/513,734, filed on Feb. 18, 2000, now abandoned, which is a continuation-in-part of application No. 09/396,007, filed on Sep. 15, 1999, now Pat. No. 6,276,072, and a continuation-in-part of application No. 09/263,126, filed on Mar. 5, 1999, now Pat. No. 6,136,163.

(51) Int. Cl.
 *C25D 5/50* (2006.01)

(52) U.S. Cl. ..................................... 148/518; 205/224

(58) Field of Classification Search ................ 148/518; 205/224
See application file for complete search history.

(56) References Cited

U.S. PATENT DOCUMENTS

| 2,026,605 | A | 1/1936 | Antisell |
| 3,649,509 | A | 3/1972 | Morawetz et al. .......... 204/238 |
| 3,727,620 | A | 4/1973 | Orr ............................ 134/95 |
| 3,770,598 | A | 11/1973 | Creutz ...................... 204/52 R |
| 4,027,686 | A | 6/1977 | Shortes et al. ............... 134/33 |
| 4,092,176 | A | 5/1978 | Kozai et al. ................ 134/186 |

(Continued)

FOREIGN PATENT DOCUMENTS

EP 0 421 735 2/1990

(Continued)

OTHER PUBLICATIONS

Lucio Colombo, "Wafer Back Surface Film Removal," Central R&D, SGS-Thompson, Microelectronics, Agrate, Italy, 6 pages.

(Continued)

*Primary Examiner*—George Wyszomierski
(74) *Attorney, Agent, or Firm*—Patterson & Sheridan LLP

(57) ABSTRACT

A method and apparatus for annealing copper. The method comprises forming a copper layer by electroplating on a substrate in an integrated processing system and annealing the copper layer in a chamber inside the integrated processing system.

2 Claims, 8 Drawing Sheets

U.S. PATENT DOCUMENTS

| | | | |
|---|---|---|---|
| 4,110,176 A | 8/1978 | Creutz et al. ............. 204/52 R |
| 4,113,492 A | 9/1978 | Sato et al. ..................... 96/67 |
| 4,265,943 A | 5/1981 | Goldstein et al. |
| 4,315,059 A | 2/1982 | Raistrick et al. ............ 429/112 |
| 4,326,940 A | 4/1982 | Eckles et al. ............... 204/232 |
| 4,336,114 A | 6/1982 | Mayer et al. ............. 204/52 R |
| 4,376,685 A | 3/1983 | Watson ..................... 204/52 R |
| 4,405,416 A | 9/1983 | Raistrick et al. ............. 204/68 |
| 4,428,815 A | 1/1984 | Powell et al. .......... 204/297 W |
| 4,435,266 A | 3/1984 | Johnston ..................... 204/276 |
| 4,481,406 A | 11/1984 | Muka et al. |
| 4,489,740 A | 12/1984 | Rattan et al. ............... 134/140 |
| 4,510,176 A | 4/1985 | Cuthbert et al. ............. 427/82 |
| 4,518,678 A | 5/1985 | Allen ........................ 430/311 |
| 4,519,846 A | 5/1985 | Aigo .......................... 134/15 |
| 4,568,431 A | 2/1986 | Polan et al. ................... 204/13 |
| 4,693,805 A | 9/1987 | Quazi .................... 204/192.22 |
| 4,732,785 A | 3/1988 | Brewer ...................... 427/240 |
| 4,786,337 A * | 11/1988 | Martin ....................... 148/518 |
| 4,789,445 A | 12/1988 | Goffman et al. ............. 204/114 |
| 4,816,098 A | 3/1989 | Davis et al. ................. 156/345 |
| 4,816,638 A | 3/1989 | Ukai et al. ............. 219/121.43 |
| 4,854,263 A | 8/1989 | Chang et al. |
| 4,904,313 A * | 2/1990 | Ames et al. ................ 148/113 |
| 5,039,381 A | 8/1991 | Mullarkey ................. 204/47.5 |
| 5,055,425 A | 10/1991 | Leibovitz et al. ........... 437/195 |
| 5,069,760 A | 12/1991 | Tsukamoto et al. ........... 205/80 |
| 5,092,975 A | 3/1992 | Yamamura et al. ......... 204/198 |
| 5,098,198 A | 3/1992 | Nulman et al. |
| 5,100,516 A | 3/1992 | Nishimura et al. ........ 205/145 |
| 5,155,336 A | 10/1992 | Gronet et al. ............... 219/411 |
| 5,156,731 A | 10/1992 | Ogasawara et al. |
| 5,162,260 A | 11/1992 | Leibovitz et al. ........... 437/195 |
| 5,168,886 A | 12/1992 | Thompson et al. |
| 5,222,310 A | 6/1993 | Thompson et al. ........... 34/202 |
| 5,224,504 A | 7/1993 | Thompson et al. ......... 134/155 |
| 5,230,743 A | 7/1993 | Thompson et al. ........... 134/32 |
| 5,248,384 A | 9/1993 | Lin et al. |
| 5,252,807 A | 10/1993 | Chizinsky ................... 219/390 |
| 5,256,274 A | 10/1993 | Poris ......................... 205/123 |
| 5,259,407 A | 11/1993 | Tuchida et al. ............. 134/151 |
| 5,290,361 A | 3/1994 | Hayashida et al. ............ 134/2 |
| 5,292,393 A | 3/1994 | Maydan et al. ............. 156/345 |
| 5,297,910 A | 3/1994 | Yoshioka et al. |
| 5,314,541 A | 5/1994 | Saito et al. |
| 5,316,974 A | 5/1994 | Crank ........................ 437/190 |
| 5,324,684 A | 6/1994 | Kermani et al. .............. 437/95 |
| 5,328,589 A | 7/1994 | Martin ........................ 205/296 |
| 5,349,978 A | 9/1994 | Sago et al. .................. 134/153 |
| 5,368,711 A | 11/1994 | Poris .......................... 204/193 |
| 5,374,594 A | 12/1994 | Van de Ven et al. |
| 5,377,425 A | 1/1995 | Kawakami et al. ............ 34/92 |
| 5,377,708 A | 1/1995 | Bergman et al. ............ 134/105 |
| 5,384,284 A | 1/1995 | Doan et al. |
| 5,415,890 A | 5/1995 | Kloider et al. ............... 427/242 |
| 5,429,733 A | 7/1995 | Ishida .................... 204/224 R |
| 5,431,700 A | 7/1995 | Sloan |
| 5,442,235 A | 8/1995 | Parrillo et al. ............... 257/758 |
| 5,447,615 A | 9/1995 | Ishida .................... 204/224 R |
| 5,449,447 A | 9/1995 | Branders ..................... 205/141 |
| 5,478,429 A | 12/1995 | Komino et al. |
| 5,484,011 A | 1/1996 | Tepman et al. |
| 5,510,216 A | 4/1996 | Calabrese et al. |
| 5,516,412 A | 5/1996 | Andricacos et al. .... 204/224 R |
| 5,527,390 A | 6/1996 | Ono et al. |
| 5,527,739 A | 6/1996 | Parrillo et al. ............... 437/198 |
| 5,608,943 A | 3/1997 | Konishi et al. ............... 15/302 |
| 5,609,688 A | 3/1997 | Hayashi et al. |
| 5,616,208 A | 4/1997 | Lee |
| 5,625,170 A | 4/1997 | Poris ........................... 177/50 |
| 5,639,301 A | 6/1997 | Sasada et al. |
| 5,651,865 A | 7/1997 | Sellers ................... 204/192.13 |
| 5,664,337 A | 9/1997 | Davis et al. |
| 5,665,167 A | 9/1997 | Deguchi et al. |
| 5,673,750 A | 10/1997 | Tsubone et al. |
| 5,677,244 A | 10/1997 | Venkatraman ............... 437/198 |
| 5,681,780 A | 10/1997 | Mihara et al. |
| 5,705,223 A | 1/1998 | Bunkofske ................... 427/240 |
| 5,716,207 A | 2/1998 | Michina et al. ............. 432/253 |
| 5,718,813 A | 2/1998 | Drummond et al. ... 204/192.12 |
| 5,723,028 A | 3/1998 | Poris .......................... 204/231 |
| 5,731,678 A | 3/1998 | Zila et al. |
| 5,807,469 A | 9/1998 | Crafts et al. |
| 5,820,692 A | 10/1998 | Baecker et al. ................ 134/21 |
| 5,830,045 A | 11/1998 | Togawa et al. |
| 5,846,598 A | 12/1998 | Semkow et al. |
| 5,853,486 A | 12/1998 | Ono et al. |
| 5,855,681 A | 1/1999 | Maydan et al. |
| 5,884,009 A | 3/1999 | Okase ......................... 392/418 |
| 5,885,134 A | 3/1999 | Shibata et al. |
| 5,885,749 A | 3/1999 | Huggins et al. |
| 5,891,513 A | 4/1999 | Dubin et al. |
| 5,907,790 A | 5/1999 | Kellam |
| 5,913,147 A | 6/1999 | Dubin et al. |
| 5,972,110 A | 10/1999 | Akimoto |
| 5,980,706 A | 11/1999 | Bleck et al. |
| 5,994,675 A | 11/1999 | Bethune et al. |
| 5,997,712 A | 12/1999 | Ting et al. |
| 6,004,047 A | 12/1999 | Akimoto et al. |
| 6,015,749 A | 1/2000 | Liu et al. ..................... 438/628 |
| 6,017,777 A | 1/2000 | Kim et al. |
| 6,017,820 A | 1/2000 | Ting et al. |
| 6,030,208 A | 2/2000 | Williams et al. |
| 6,037,257 A | 3/2000 | Chiang et al. |
| 6,062,852 A | 5/2000 | Kawamoto et al. |
| 6,071,388 A | 6/2000 | Uzoh .......................... 204/297 |
| 6,072,163 A | 6/2000 | Armstrong et al. |
| 6,091,498 A | 7/2000 | Hanson et al. |
| 6,093,291 A | 7/2000 | Izumi et al. ................. 204/224 |
| 6,103,638 A | 8/2000 | Robinson |
| 6,113,698 A | 9/2000 | Raaijimakers et al. |
| 6,123,825 A | 9/2000 | Uzoh et al. |
| 6,136,163 A | 10/2000 | Cheung et al. ............. 204/198 |
| 6,151,447 A | 11/2000 | Moore et al. |
| 6,155,275 A | 12/2000 | Shinbara |
| 6,171,922 B1 | 1/2001 | Maghsoudnia |
| 6,174,388 B1 | 1/2001 | Sikka et al. |
| 6,178,623 B1 * | 1/2001 | Kitazawa et al. ............. 29/825 |
| 6,182,376 B1 | 2/2001 | Shin et al. |
| 6,187,152 B1 | 2/2001 | Ting et al. ............... 204/224 R |
| 6,203,582 B1 | 3/2001 | Berner et al. ............. 29/25.01 |
| 6,207,005 B1 | 3/2001 | Henley et al. ............... 156/345 |
| 6,207,937 B1 | 3/2001 | Stoddard et al. |
| 6,211,495 B1 | 4/2001 | Stoddard et al. |
| 6,213,853 B1 | 4/2001 | Gonzalez-Martin et al. |
| 6,222,164 B1 | 4/2001 | Stoddard et al. |
| 6,228,768 B1 | 5/2001 | Woo et al. |
| 6,241,869 B1 * | 6/2001 | Maeda ........................ 205/137 |
| 6,242,349 B1 | 6/2001 | Nogami et al. |
| 6,258,220 B1 | 7/2001 | Dordi et al. ................. 204/198 |
| 6,258,223 B1 | 7/2001 | Cheung et al. |
| 6,263,587 B1 | 7/2001 | Raaijimakers et al. |
| 6,264,752 B1 | 7/2001 | Curtis et al. |
| 6,267,853 B1 | 7/2001 | Dordi et al. ................. 204/232 |
| 6,276,072 B1 | 8/2001 | Morad et al. ................. 34/428 |
| 6,290,833 B1 | 9/2001 | Chen |
| 6,290,865 B1 | 9/2001 | Lloyd et al. ................... 216/92 |
| 6,290,933 B1 | 9/2001 | Durga et al. ................. 424/49 |
| 6,294,059 B1 | 9/2001 | Hongo et al. ............... 204/198 |
| 6,294,219 B1 | 9/2001 | Tsai et al. |
| 6,296,906 B1 | 10/2001 | Stimmell et al. |
| 6,297,154 B1 | 10/2001 | Gross et al. |
| 6,307,184 B1 | 10/2001 | Womack et al. |
| 6,309,520 B1 | 10/2001 | Woodruff et al. ........... 204/242 |

| | | | | | |
|---|---|---|---|---|---|
| 6,355,153 B1 * | 3/2002 | Uzoh et al. ............... 205/87 | WO | 93/17448 | 9/1993 |
| 6,357,143 B2 | 3/2002 | Morad et al. | WO | 97/12079 | 4/1997 |
| 6,387,182 B1 | 5/2002 | Horie et al. | WO | 99/40615 | 8/1999 |
| 6,423,947 B2 | 7/2002 | Womack et al. | | | |
| 6,471,913 B1 | 10/2002 | Weaver et al. | | | |
| 6,473,993 B1 | 11/2002 | Yagi et al. | | | |
| 6,477,787 B2 | 11/2002 | Morad et al. | | | |
| 6,483,081 B1 | 11/2002 | Batchelder | | | |
| 6,508,920 B1 | 1/2003 | Ritzdorf et al. ........... 204/194 | | | |
| 6,512,206 B1 | 1/2003 | McEntire et al. | | | |
| 6,529,686 B2 | 3/2003 | Ramana et al. | | | |
| 6,532,772 B1 | 3/2003 | Robinson | | | |
| 6,544,338 B1 | 4/2003 | Batchelder et al. | | | |
| 6,566,255 B2 | 5/2003 | Ito | | | |
| 6,635,157 B2 | 10/2003 | Dordi et al. | | | |
| 6,639,189 B2 | 10/2003 | Ramana et al. | | | |
| 6,658,763 B2 | 12/2003 | Morad et al. | | | |
| 6,929,774 B2 | 8/2005 | Morad et al. | | | |
| 2001/0030101 A1 | 10/2001 | Berner et al. ............ 198/346.1 | | | |
| 2002/0000271 A1 | 1/2002 | Ritzdorf et al. ........... 148/518 | | | |
| 2002/0004301 A1 | 1/2002 | Chen et al. | | | |
| 2002/0022363 A1 | 2/2002 | Ritzdorf et al. ........... 438/672 | | | |
| 2002/0029961 A1 | 3/2002 | Dordi et al. ............... 204/198 | | | |
| 2002/0037641 A1 | 3/2002 | Ritzdorf et al. ........... 438/618 | | | |
| 2002/0074233 A1 | 6/2002 | Ritzdorf et al. ........... 205/157 | | | |
| 2002/0102837 A1 | 8/2002 | Ritzdorf et al. | | | |
| 2003/0045095 A1 | 3/2003 | Ritzdorf et al. | | | |
| 2004/0079633 A1 | 4/2004 | Cheung et al. | | | |
| 2004/0084301 A1 | 5/2004 | Dordl et al. | | | |

FOREIGN PATENT DOCUMENTS

| | | |
|---|---|---|
| EP | 0829904 | 3/1998 |
| EP | 0725427 | 8/1998 |
| EP | 0 881 673 | 12/1998 |
| EP | 1 037 263 | 9/2000 |
| EP | 1 085 557 | 3/2001 |
| JP | 54 148112 | 11/1979 |
| JP | 58182823 | 10/1983 |
| JP | 63118093 | 5/1988 |
| JP | 04131395 | 5/1992 |
| JP | 04280993 | 10/1992 |
| JP | 6017291 | 1/1994 |
| JP | 10 079432 | 3/1998 |

OTHER PUBLICATIONS

Semitool, Inc., "Metallization & Interconnect," 1998, 4 pages.
Laurell Technologies Corporation, "Two control configurations available-see *WS 400 or WS-400Lite*." Oct. 19, 1998, 6 pages.
Peter Singer, "Tantalum, Copper and Damascene: The Future of Interconnects," Semiconductor International, Jun. 1998, Pages cover, 91-91, 94, 96 & 98.
Peter Singer, "Wafer Processing," Semiconductor International, Jun. 1998, p. 70.
Kenneth E. Pitney, "NEY Contact Manual," Electric Contacts for Low Energy Uses, 1973.
Gurtej S. Sandhu et al., "Variations in Cu CMP Removal Rate Due to Cu Film Self-Annealing," Advanced Metallization Conference in 1998 (AMC 1998), 8 pages.
Cindy R. Simpson et al., "The Electrical Integrity of Copper Plated Wafers Using a Novel Plating Both Chemistry" Abstract No. 727, 1 page.
European Search Report from EP 0110 3525 dated Jul. 10, 2001.
Singapore Search Report for Application 2000/05246-4 dated Apr. 30, 2002.
Cindy R. Simpson et al., "The Electrical Integrity of Copper Plated Wafers Using a Novel Plating Both Chemistry" Slides Publicly Disclosed, 13 pages Oct. 17-22, 1999.
Singapore Search Report for Application 00010504 dated May 23, 2001.
European Search Report for Application 301415.6 dated Dec. 11, 2000.
Austrian Patent Office International Search Report dated Feb. 7, 2000 for Singapore Application No. 00010504.
Decision on First Patent Examination by Taiwan Intellectual Property Office, Ministry of Economic Affairs dated Apr. 9, 2002 and cited reference 86103261.
Hohm, et al. "Stationary Contacts," Electric Contacts Theory and Applications, Springer-Verlag, New York, Inc. 1967, pp. 1-375.
Wright, et al. "Low temperature etch chuck: Modeling and experimental results of heat transfer and wafer temperature," J. Vac. Sci. Technol. A. 10(4), Jul./Aug. 1992, pp. 1065-1070.

* cited by examiner

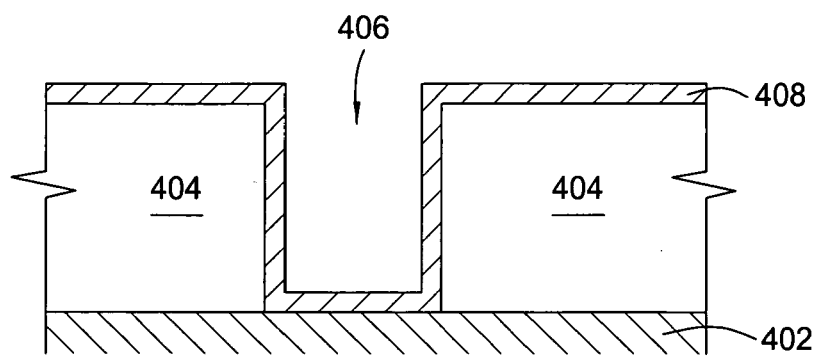
FIG. 4A
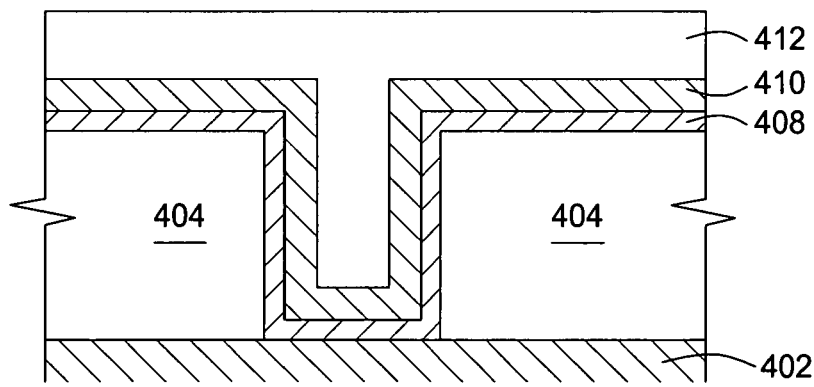
FIG. 4B
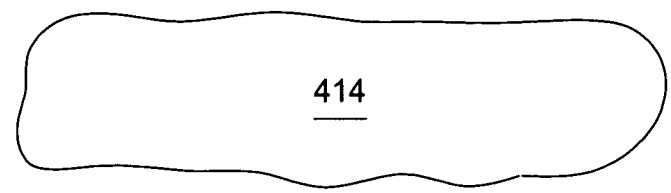
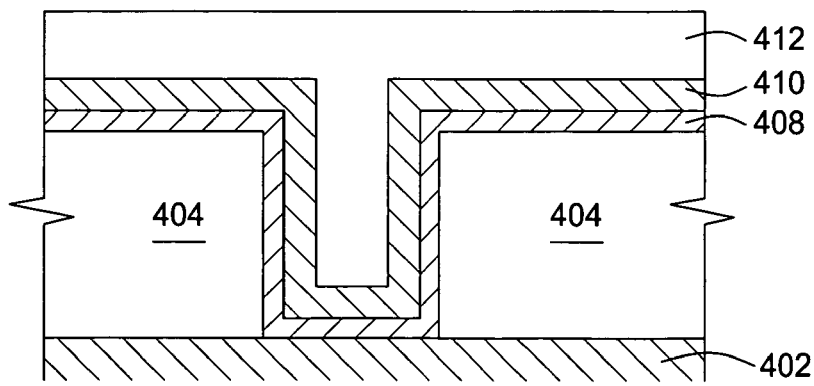
FIG. 4C

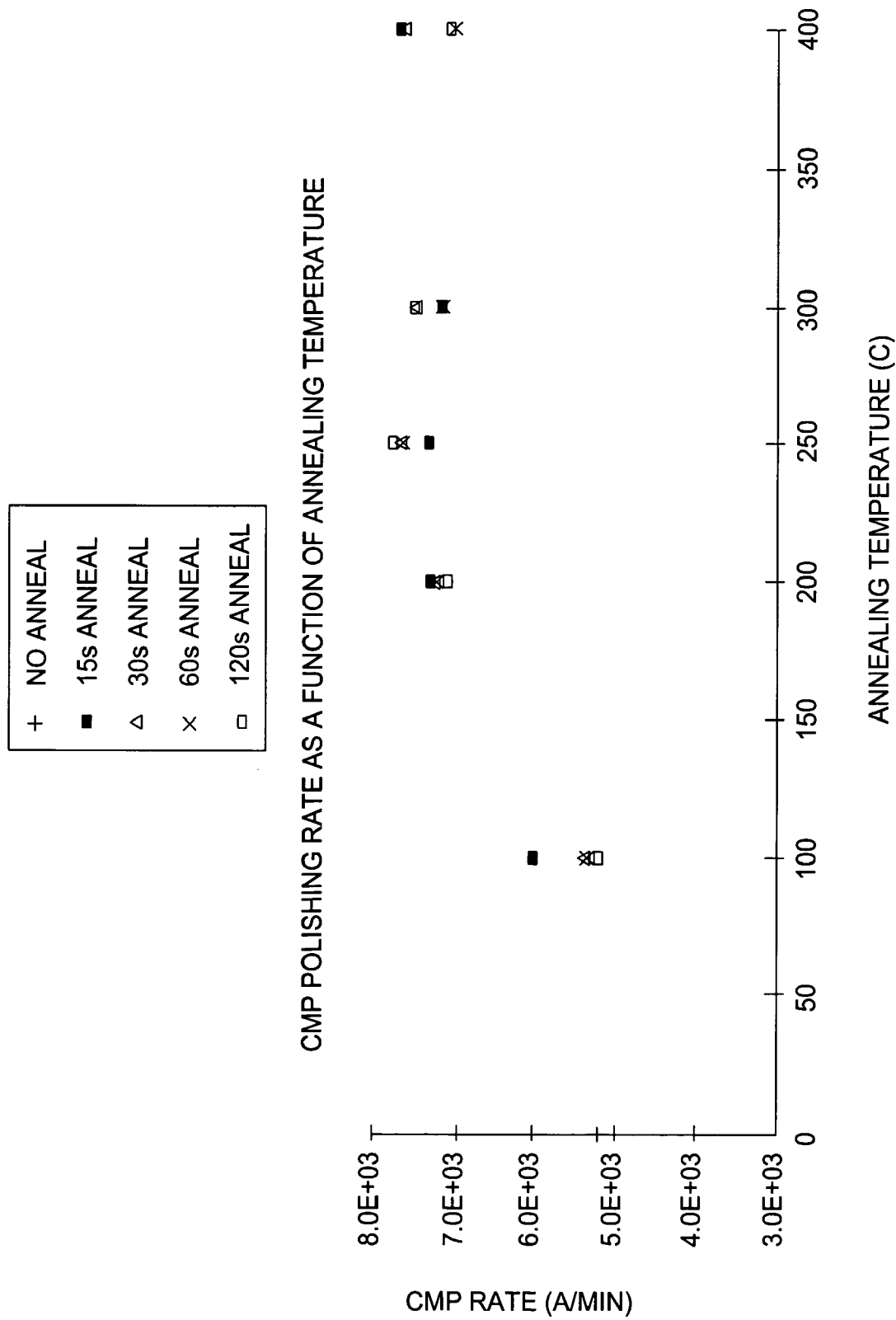

METHOD AND APPARATUS FOR ANNEALING COPPER FILMS

CROSS-REFERENCE TO RELATED APPLICATIONS

This application is a divisional of now abandoned U.S. patent application Ser. No. 09/513,734, filed Feb. 18, 2000, which is a continuation-in-part of commonly-assigned U.S. patent application, entitled "Method and Apparatus for Heating and Cooling Substrates", Ser. No. 09/396,007, filed on Sep. 15, 1999, now U.S. Pat. No. 6,276,072, and of commonly-assigned U.S. patent application, entitled "Apparatus for Electrochemical Deposition of Copper Metallization with the Capability of In-Situ Thermal Annealing", Ser. No. 09/263,126, filed on Mar. 5, 1999, now U.S. Pat. No. 6,136,163, both of which are herein incorporated by reference.

BACKGROUND OF THE INVENTION

1. Field of the Invention

The invention relates to a method and apparatus for metal processing and, more particularly, to a method and apparatus for depositing and annealing metal films.

2. Background of the Related Art

Copper has gained increasing popularity as a metal interconnect in advanced integrated circuit fabrication. Copper can be deposited using electrochemical deposition from electrolytes such as copper sulfate or from electroless processes. Typically, electrolytes also contain carriers and additives to achieve certain desired characteristics in electroplated films. Some copper films, e.g., those deposited from electrolytes containing organic additives, exhibit "self-annealing" or re-crystallization behavior. For example, abnormal grain growth may occur in the as-deposited film such that film properties such as resistivity, stress and hardness may be adversely affected. The rate of grain growth may depend on the electroplating recipe, electrolyte types, as well as the organic additive concentrations.

These continual changes in microstructure at room temperature may lead to formation of stress-induced voids, or affect subsequent chemical mechanical polishing (CMP) behavior because of varying polishing rates for the film. Therefore, thermal annealing is usually performed on the as-deposited copper film to stabilize the film by promoting grain growth prior to subsequent processing.

Typically, copper films are annealed in a high temperature furnace or using rapid thermal anneal processing, both of which require relatively expensive and complex equipments. Furnace anneal of electroplated copper films, for example, is a batch process that is performed at an elevated temperature of typically about 400° C., either under a vacuum or in a nitrogen environment for at least about 30 minutes, which is a rather high thermal budget, time-consuming and costly process.

Therefore, there is a need for a method and apparatus for annealing copper that would allow film stabilization to be performed at a relatively low operating temperature in a simple gas environment with wide process windows, along with high throughput and relatively low cost.

SUMMARY OF THE INVENTION

The present invention provides a method and apparatus for annealing copper by forming a copper layer on a substrate in an integrated processing system, and then treating the copper layer in an annealing gas environment.

In one embodiment of the invention, the annealing process is performed in-situ. The gas environment comprises a gas selected from nitrogen, argon, helium, or other inert gases. Annealing is performed at a temperature between about 100 and about 500° C., for a time duration of less than about 5 minutes. In another embodiment, the annealing gas further comprises a hydrogen-containing gas, e.g., hydrogen. In another aspect of the invention, the annealing gas environment is controlled so that the concentration of an oxidizing gas, e.g., oxygen, is less than about 100 parts per million.

BRIEF DESCRIPTION OF THE DRAWINGS

The teachings of the present invention can be readily understood by considering the following detailed description in conjunction with the accompanying drawings, in which:

FIGS. 4a–c depict cross-sectional views of a substrate undergoing various stages of metal processing. FIG. 4a depicts a substrate with an insulating layer and a barrier layer prior to copper deposition. FIG. 4b depicts the substrate with a seed layer and a layer of electroplated copper. FIG. 4c depicts the layer of electroplated copper under an annealing gas environment;

FIG. 8 depicts a plot of the chemical mechanical polishing rate as a function of anneal temperature for different annealing times.

To facilitate understanding, identical reference numerals have been used, where possible, to designate identical elements that are common to the figures.

DETAILED DESCRIPTION OF THE PREFERRED EMBODIMENT

The method of the present invention performs annealing of a copper layer by exposing the copper layer to an annealing gas environment at an elevated temperature.

In one embodiment of the invention, the annealing is performed in-situ—i.e., within the same apparatus as that used for depositing the copper layer. The annealing gas environment comprises a gas selected from nitrogen ($N_2$), argon (Ar) or helium (He), or other inert gases. Annealing is performed at a temperature between about 100 and about 500° C. for a time duration less than about 5 minutes. In another embodiment, the annealing gas environment further comprises hydrogen ($H_2$), preferably a mixture of less than about 5% of $H_2$ in $N_2$ or other inert gas. In another aspect of the invention, the annealing gas environment preferably has an oxygen concentration of less than about 100 parts per million (ppm), more preferably less than about 30 ppm. By exposing the copper layer to the annealing gas environment within a short time, e.g., less than about five minutes, at an annealing temperature between about 100 and about 500° C., the microstructure of the copper layer can be stabilized and a reduced film resistivity and/or enhanced reflectivity of the copper layer can be achieved.

Apparatus

Figure 1:
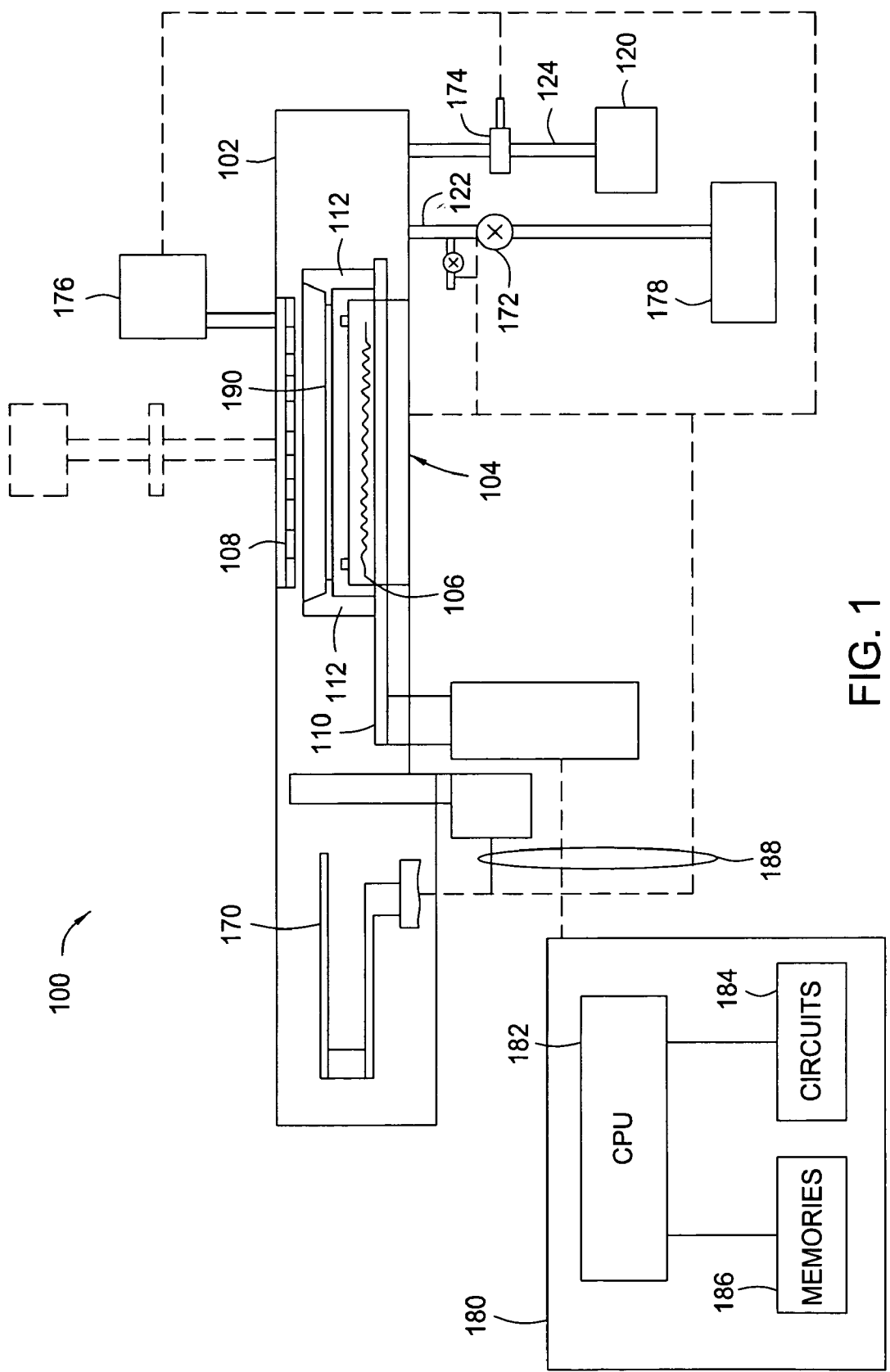
FIG. 1 depicts a schematic side elevational view of an apparatus that is suitable for practicing the present invention.

FIG. 1 is a schematic representation of an apparatus 100 that is suitable for practicing the present invention. The apparatus 100 comprises a process chamber 102 and a controller 180 connected to various hardware components (e.g., wafer handling robot 170, isolation valve 172 and mass flow controller 174, among others.)

A detailed description of the chamber 102 has been disclosed in commonly-assigned U.S. patent application, entitled "Method and Apparatus for Heating and Cooling Substrates", Ser. No. 09/396,007, filed on Sep. 15, 1999, and is incorporated herein by reference. A brief description of the apparatus 100 is given below.

The apparatus 100 allows for rapid heating and cooling of a substrate within a single chamber 102, which comprises a heating mechanism, a cooling mechanism and a transfer mechanism to transfer a substrate 190 between the heating and the cooling mechanisms. As shown in the embodiment of FIG. 1, the heating mechanism comprises a heated substrate support 104 having a resistive heating element 106, and the cooling mechanism comprises a cooling fluid source 176 connected to a cooling plate 108 disposed at a distance apart from the heated substrate support 104. The transfer mechanism is, for example, a wafer lift hoop 110 having a plurality of fingers 112, which is used to transfer a substrate from a position proximate the heated substrate support 104 to a position proximate the cooling plate 108. A vacuum pump 178 and an isolation valve 172 are connected to an outlet 122 of the chamber 102 for evacuation and control of gas flow out of the chamber 102.

To perform copper annealing, the substrate 190 is placed on the heated substrate support 104, which is preheated to a temperature between about 100° C. and about 500° C. A gas source 120 allows an annealing gas mixture to enter the chamber 102 via the gas inlet 124 and the mass flow controller 174. The substrate 190 having a deposited copper layer is then heated under the annealing gas environment for a sufficiently long time to obtain the desired film characteristics. For example, the copper layer may be annealed to achieve a desirable grain growth condition, a reduction in sheet resistance, or an increase in film reflectivity.

After annealing, the substrate 190 is optionally cooled to a desirable temperature, e.g., below about 100° C., preferably below about 80° C., and most preferably below about 50° C., within the chamber 102. This can be accomplished, for example, by bringing the substrate 190 in close proximity to the cooling plate 108 using the wafer lift hoop 110. For example, the cooling plate 108 may be maintained at a temperature of about 5 to about 25° C. by a cooling fluid supplied from the cooling fluid source 176.

As illustrated in FIG. 1, the chamber 102 is also coupled to a controller 180, which controls the chamber 102 for implementing the annealing method of the present invention. Illustratively, the controller 180 comprises a general purpose computer or a central processing unit (CPU) 182, support circuitry 184, and memories 186 containing associated control software. The controller 180 is responsible for automated control of the numerous steps required for wafer processing—such as wafer transport, gas flow control, temperature control, chamber evacuation, and so on. Bi-directional communications between the controller 180 and the various components of the apparatus 100 are handled through numerous signal cables collectively referred to as signal buses 188, some of which are illustrated in FIG. 1.

Figure 2:
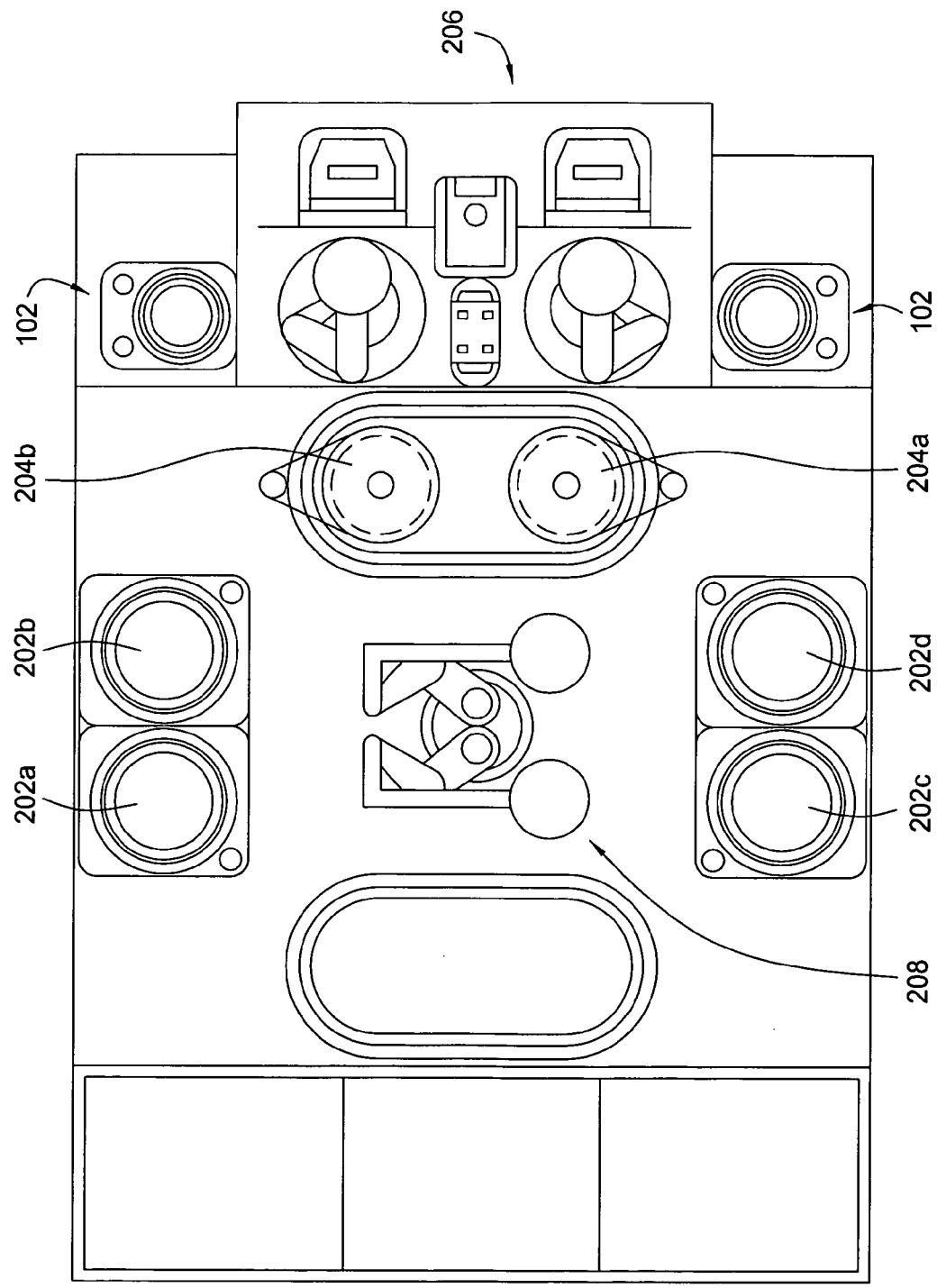
FIG. 2 depicts a top plan view of an integrated processing system comprising the apparatus of FIG. 1.

In general, the annealing chamber 102 may be used as a stand alone system for thermal annealing or wafer cooling. Alternatively, the chamber 102 may be used as part of a cluster tool or an integrated processing system having multiple process chambers associated therewith. As illustrated in FIG. 2, for example, an integrated processing system 200 comprises several process chambers such as metal deposition chambers 202a, 202b, 202c and 202d, cleaning stations 204a and 204b, two annealing chambers 102 and a loading station 206. A robot 208 is provided for wafer transfer and handling. Details of an integrated processing system have been disclosed in commonly assigned U.S. patent application, Ser. No. 09/263,126, entitled "Apparatus for Electrochemical Deposition of Copper Metallization with the Capability of In-Situ Thermal Annealing", filed on Mar. 5, 1999, which is herein incorporated by reference. An Electra Cu™ Integrated ECP system is one example of such an integrated processing system 200, and is commercially available from Applied Materials, Inc., of Santa Clara, Calif.

During integrated processing, a copper layer is formed on a substrate 190 in one of the processing chambers 202a–d using electroplating or other deposition techniques. After suitable cleaning processes inside the cleaning station 204 or 206, the substrate 190 having the deposited copper layer is transferred to the annealing chamber 102 by a transfer mechanism such as a robot 170. Thus, the integrated processing system allows in-situ annealing of the copper layer—i.e., annealing the deposited copper layer without removing the substrate from the system. One advantage of such in-situ processing is that the time delay between the cleaning and annealing steps can be kept relatively short, e.g., to about a few seconds. Therefore, undesirable oxidation of the deposited copper layer can be minimized. A controller (not shown) is also used to control the operation of the integrated processing system 200 in a manner similar to that previously described for the annealing chamber 102.

Process

Figure 3:
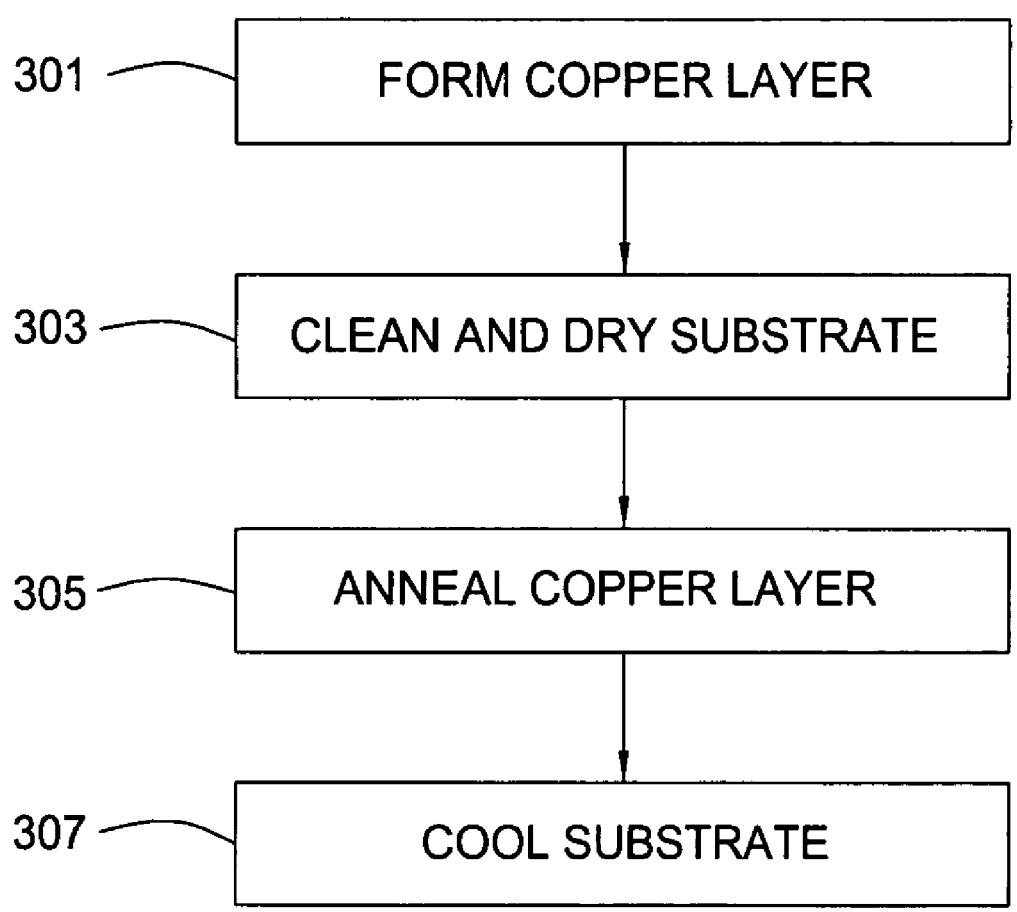
FIG. 3 depicts a process sequence illustrating the method steps of metal deposition and annealing.

FIG. 3 depicts a process sequence 300 for annealing a copper layer according to one embodiment of the invention. This process sequence 300, for example, may be implemented by the integrated system 200 when the controller (not shown) executes a software program embodying the appropriate program code. In step 301, a copper layer is formed on a substrate using a copper deposition technique—e.g., electroplating or an electroless process. The invention will be described with reference to a copper film formed by electroplating. It should be understood, however, that the invention can also be used to anneal copper films formed by other deposition techniques. Characteristics of the copper layer may vary with the copper deposition process and thus affect process conditions to be employed, for example, in subsequent annealing of the copper layer. After the copper deposition step 301, the substrate undergoes appropriate cleaning in step 303, e.g., through a de-ionized water rinse and dry procedure.

According to the present invention, the copper layer is then annealed in step 305 in an annealing gas environment at an elevated temperature, e.g., between about 100 and about 500° C. In one embodiment, the annealing gas environment comprises a gas selected from nitrogen, argon and helium. In general, these and other inert gases may be used either singly or in combinations to form the annealing gas environment. In another embodiment, the annealing gas environment further comprises a hydrogen-containing gas, preferably hydrogen ($H_2$). Alternatively, other hydrogen-containing gases, e.g., ammonia ($NH_3$), may also be used. A total gas flow of up to about 50 standard liters per minute (slm) and a pressure of up to about 1000 torr may be used. In general, the process window for the operating pressure is relatively wide—e.g., in one embodiment, about 760 to about 1000 torr may be used. In addition, annealing may also be performed under a reduced pressure condition. The annealing step 305 results in a decrease in sheet resistance of the copper layer. Additionally, reflectivity of the copper layer may also be increased through the annealing step 305.

After annealing, the substrate may be subjected to a cooling step 307, e.g., for about 30 seconds, to cool the substrate to a temperature below about 100° C., preferably below about 80° C., and most preferably below about 50° C., before additional processing. Using the chamber 102, for example, annealing and cooling of the substrate can be performed in a single chamber within the integrated processing system. In general, the cooling step 307 serves several purposes, such as preventing oxidation of the copper layer when the substrate is exposed to ambient air, and providing a suitable temperature for wafer handling and reliable system operation. It has been found that there is no noticeable oxidation in a copper layer treated under the annealing gas environment of the present invention when the substrate is exposed to ambient air at below about 100° C.

FIGS. 4a–c illustrate schematic cross-sectional views of a substrate structure 450 undergoing various stages of processing according to the process sequence 300. FIG. 4a shows an exemplary substrate structure 450 prior to copper deposition, comprising a patterned insulating layer 404 formed on an underlying layer 402. Depending on whether the substrate structure 450 is a contact, via or trench, the underlying layer 402 may comprise, for example, silicon, polysilicon, silicide, copper, tungsten or aluminum, among others. The insulating layer 404 may be an oxide layer that has been patterned by conventional lithographic and etching techniques to form a contact, via or trench 406. A barrier layer 408 comprising a conducting material (e.g., titanium, titanium nitride, tantalum, or tantalum nitride, among others) is formed over the insulating layer 404 and inside the via 406 using conventional techniques such as physical vapor deposition (PVD) or CVD. The barrier layer 408 has a typical thickness up to about 500 Å, and preferably about 250 Å.

When electroplated copper is to be used to form the metal interconnect, a relatively thin seed layer of metal 410, preferably copper, is vapor deposited over the barrier layer 408, as shown in FIG. 4b. Typically, the seed layer of metal 410 has a thickness of up to about 3000 Å, e.g., about 2000 Å, and may be deposited using IMP (ionized metal plasma) physical sputtering. In one example, a bulk layer of copper 412 having a thickness up to about 2 μm, is then formed over the seed layer 410 by electroplating, for example, using the electroplating system. The electroplated copper layer 412 can be used to fill contacts, trenches or vias having widths of about 0.25 μm or smaller, or aspect ratios of at least about 2:1.

According to the present invention, the deposited copper layer 412 is then subjected to an annealing step under an annealing gas environment 414, as shown in FIG. 4c. The annealing gas environment 414 comprises a gas selected from $N_2$, Ar or He, among others. These and other inert gases may also be used singly or in combinations to form the annealing gas environment 414. In another embodiment, the annealing gas environment 414 further comprises a hydrogen-containing gas such as hydrogen ($H_2$). Other hydrogen-containing gases, e.g., ammonia ($NH_3$) may also be used. In one embodiment, $H_2$ is present at a concentration of less than about 5%, preferably between about 0.5 to about 4%. In principle, a higher concentration of $H_2$ (i.e., over 5%) may be used for effective treatment of the deposited copper layer, but it is not necessary. A low $H_2$ concentration mixture is preferred because of the reduced manufacturing cost. Thus, there is an incentive to provide an annealing mixture with as low a $H_2$ concentration as possible. For example, in one embodiment, a mixture of $H_2$ and nitrogen ($N_2$) is used with a $H_2$ concentration of less than about 4%. Aside from $N_2$, inert gases such as argon (Ar), helium (He), among others, may also be used. A total gas flow of up to about 50 slm and a pressure of up to about 1000 torr, e.g., between about 760 to about 1000 torr, may be used.

In another embodiment, the annealing gas environment 414 is also controlled to contain at most a low level of an oxidizing gas such as oxygen ($O_2$), in order to avoid oxidation of the copper layer 412. If the annealing gas environment contains only nitrogen or an inert gas, but does not contain $H_2$, then the level of $O_2$ is preferably controlled to be less than about 30 ppm, preferably less than about 10 ppm, and most preferably, less than about 5 ppm. On the other hand, if $H_2$ is present in the annealing gas environment 414, the level of $O_2$ that can be tolerated may be higher, e.g., less than about 100 ppm, due to the reducing effect of $H_2$ which minimizes oxidation of the copper layer. It is preferable that the $O_2$ level be controlled to less than about 30 ppm, more preferably less than about 10 ppm, and most preferably, less than about 5 ppm.

In general, the copper layer 412 is annealed for a time duration of less than about 5 minutes, at a temperature of between about 100 to about 500° C. The specific annealing time may depend on the nature and thickness of the as-deposited copper layer 412 and the temperature of the substrate structure 450. For example, previous self-annealing studies conducted at room temperature show that to achieve stabilization of a 1 micron copper film, annealing has to be performed for a sufficiently long time to result in a sheet resistance change (i.e., decrease) of about 18–20%. From a manufacturing point of view, a shorter annealing time is preferable because it contributes to a higher process throughput. However, the optimal choice will depend on a proper balance of other process considerations—e.g., for certain applications, thermal budget concerns may suggest the use of a lower temperature along with a slightly longer treatment time. Thus, according to one embodiment of the invention, annealing is performed for a time duration between about 30 seconds to about 2 minutes, at a temperature between about 150 to about 400° C. In one preferred embodiment, the annealing time is about 30 seconds at a temperature of about 250° C.

Sheet Resistance

Figure 5:
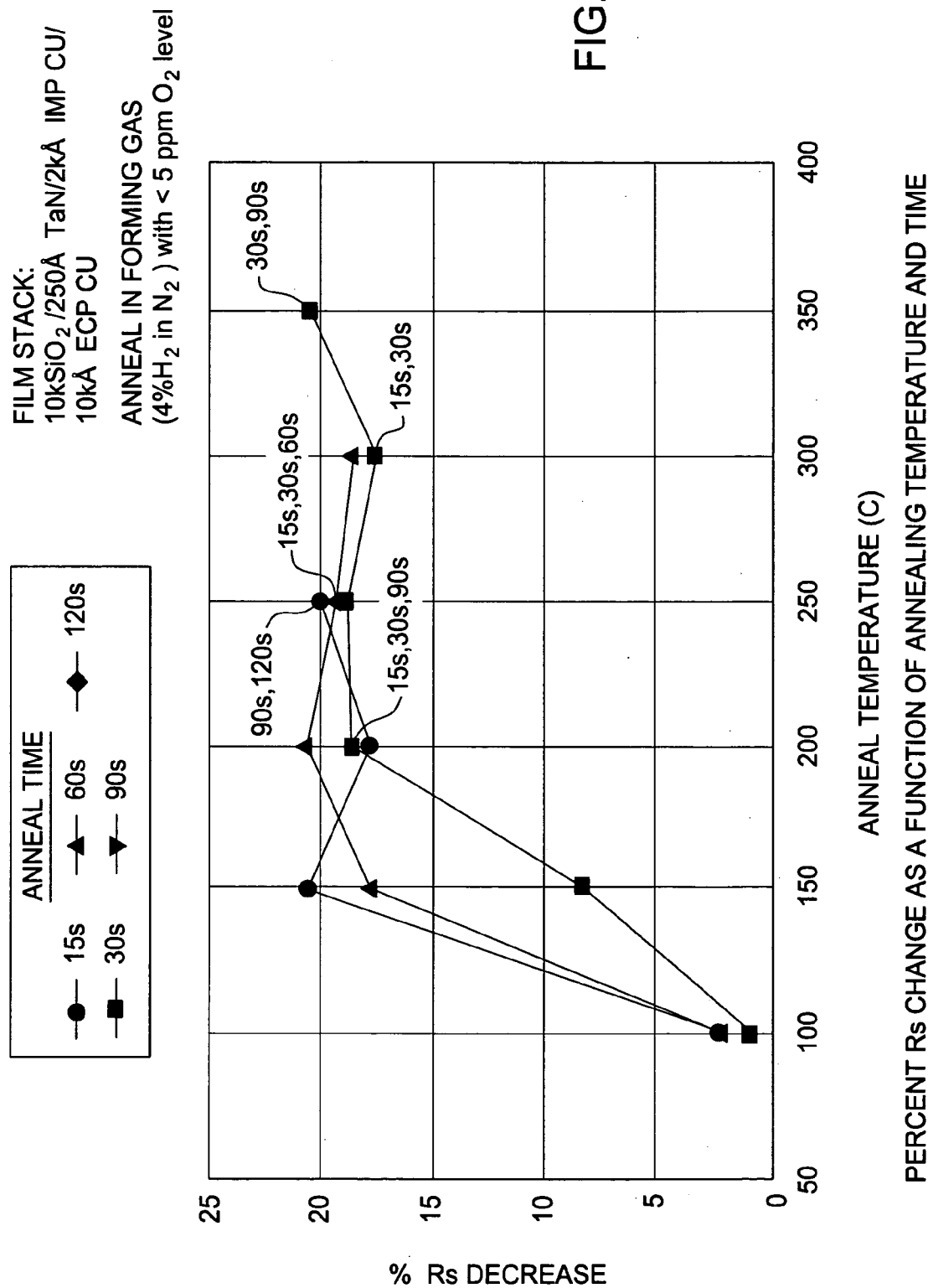
FIG. 5 depicts a plot of the sheet resistance change of a copper layer as a function of anneal temperature for different annealing times.

FIG. 5 shows a plot of the percentage of sheet resistance (Rs) decrease of a metal film stack as a function of the annealing temperature for various annealing times. The metal film stack comprises a 1 micron layer of electroplated copper formed upon a 2000 Å copper seed layer (formed by IMP PVD deposition) over a 250 Å thick tantalum nitride (TaN) film. For example, when the film is annealed at a temperature of about 150° C., a decrease in sheet resistance of about 8% is achieved after 30 seconds of annealing. After 60 seconds of annealing, the sheet resistance is reduced by about 17% and by about 20% after about 120 seconds of anneal.

The data in FIG. 5 suggests that film stabilization and reduction in sheet resistance can be achieved rapidly—e.g., in less than about 2 minutes, if annealing is performed at a temperature greater than about 150° C. It is believed that the sheet resistance may be improved by annealing at a temperature between about 100° C. and about 500° C., and preferably, between about 150° C. and 400° C., for a time duration between about 30 sec. to about 120 sec. For higher annealing temperatures, e.g., at about 200° C. or higher, a shorter annealing time such as 15 sec. may suffice. A copper layer annealed according to the embodiments of the invention can achieve a resistivity of below about 1.8 μohm-cm. For example, based on an extended run of about 2000 wafers, it is found that the annealed copper layer has a resistivity approaching the theoretical bulk resistivity of copper, which is about 1.7 μohm-cm. Furthermore, the wafer to wafer sheet resistance uniformity is also improved to about 0.6%, compared to about 1.7% obtained for as-deposited films.

Reflectivity

Figure 6:
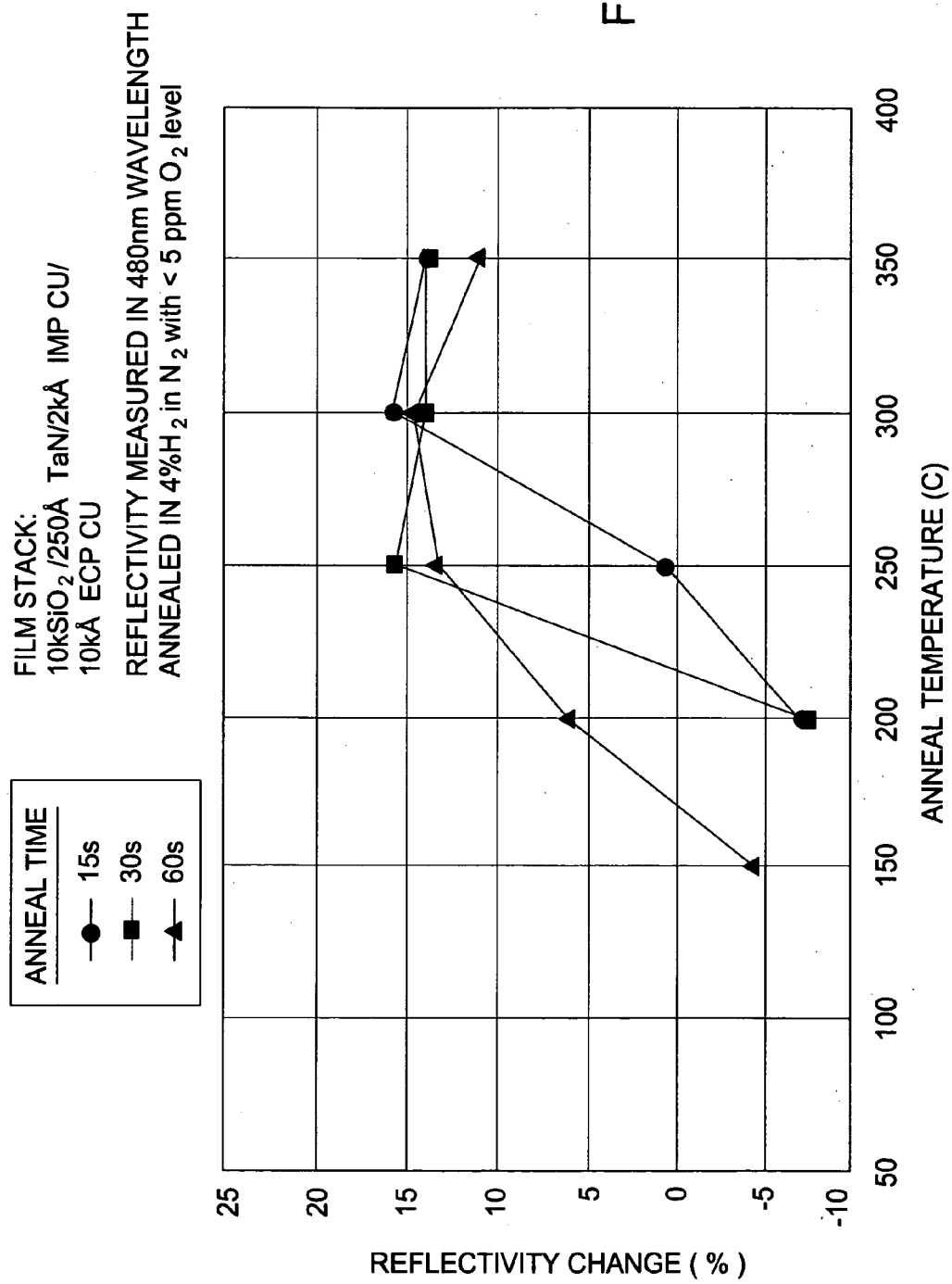
FIG. 6 depicts a plot of the reflectivity change of a copper layer as a function of anneal temperature for different annealing times.

Aside from sheet resistance, the reflectivity of the electroplated layer is also another factor for evaluating the annealing process. In general, the reflectivity of a copper layer may be affected by the copper grain size (affecting surface roughness) and the composition of the copper surface. FIG. 6 illustrates the percent reflectivity change for a film stack as a function of anneal temperature for different annealing times. The reflectivity is measured at a wavelength of 480 nm for a film stack comprising a 10,000 Å electroplated copper layer over a 2000 Å sputtered copper film that has been deposited upon a 250 Å of tantalum nitride (TaN) over a 10,000 Å silicon oxide layer. In this embodiment, the annealing gas environment comprises a mixture of about 4% $H_2$ in $N_2$. Preferably, the annealing gas has an oxygen content of less than about 30 ppm, more preferably less than about 10 ppm, and most preferably less than about 5 ppm.

In general, the reflectivity of the Cu layer increases with increasing annealing time and temperature. For example, at an annealing temperature of about 200° C., the film reflectivity improves—i.e., has a positive reflectivity change, after annealing for about 60 seconds. When the temperature is increased to about 250° C., the electroplated copper layer achieves a maximum of about 15% improvement in reflectivity after being annealed for about 30 seconds. However, no additional improvement is obtained even at a longer annealing time of about 60 seconds. At about 300° C. or higher, the anneal time has little impact on reflectivity, and only about 15 seconds of annealing is needed to achieve the maximum reflectivity change of about 15%.

Thus, in order to improve reflectivity of a copper layer according to one embodiment of the present invention, copper annealing is preferably performed at a temperature of at least about 200° C., and preferably at least about 250° C. A copper layer annealed according to the embodiments of the invention can achieve a reflectivity of about 1.35 times that of a silicon reference, exceeding the typical customer requirement of about 1.2. In addition, it is found that the annealed copper layer can retain a high reflectivity without degradation after being exposed to ambient air environment.

Effect of $H_2$ Content

Figure 7:
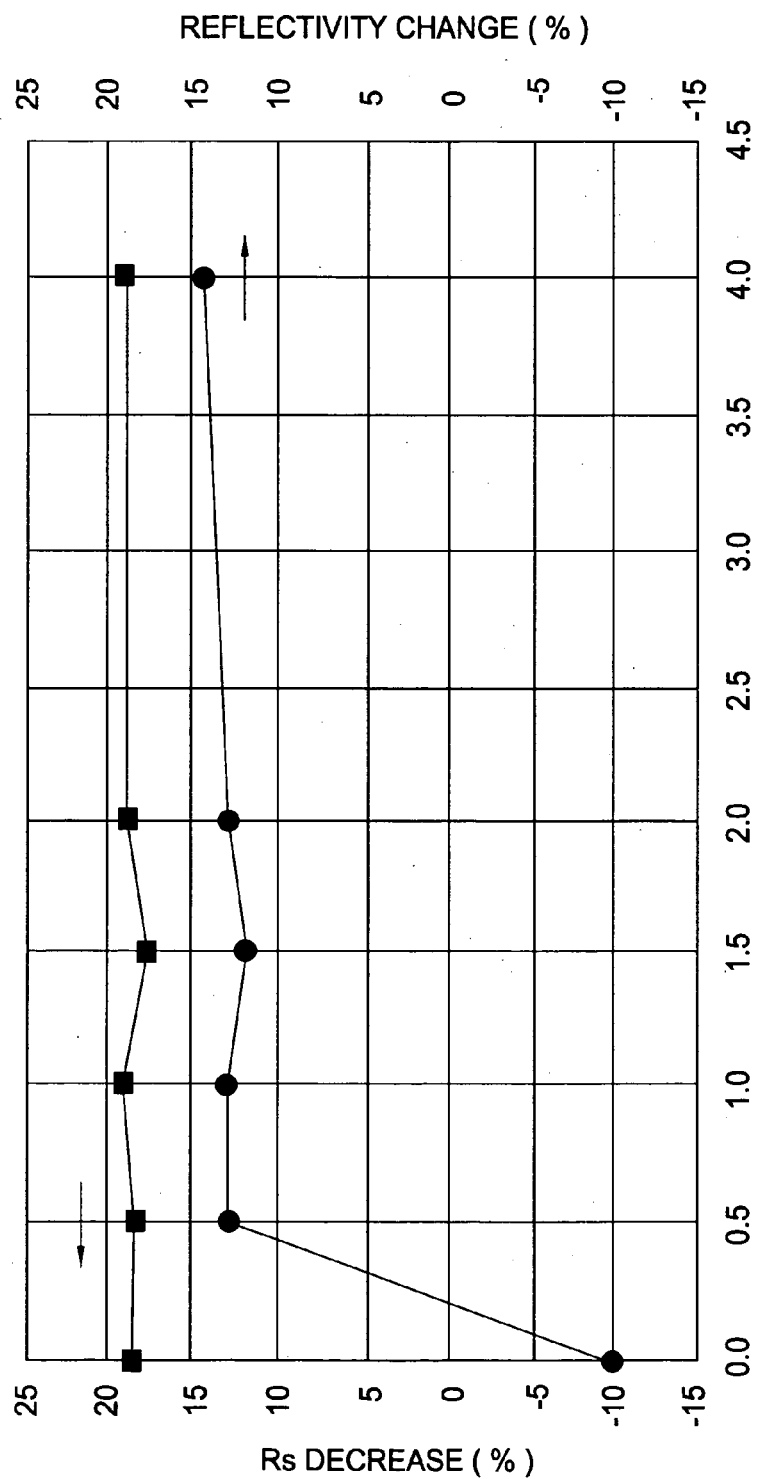
FIG. 7 depicts the sheet resistance and reflectivity changes as a function of hydrogen content in an annealing gas environment.

The annealing effect is further investigated as a function of the hydrogen content in the chamber environment. This is illustrated in FIG. 7, which shows the changes in sheet resistance and film reflectivity as a function of $H_2$ concentration up to about 4%. At an annealing temperature of about 300° C., the sheet resistance decrease of about 18–20% is achieved, independent of the $H_2$ concentration. This suggests that the sheet resistance decrease in this case is primarily a temperature-dependent effect.

On the other hand, the reflectivity change depends on the $H_2$ content—e.g., at a $H_2$ concentration of about 0.5% or higher, a 15% improvement in film reflectivity is achieved. It is believed that reflectivity is increased partly because $H_2$ gas is effective in minimizing oxide formation on the surface of the copper layer. It is possible that, by adjusting other process parameters such as temperature, pressure, annealing time and gas environment, a lower $H_2$ concentration, e.g., below about 0.5%, may also be effective in improving reflectivity of the copper layer.

Annealing according to the embodiments of the invention result in an increase of the grain size in the electroplated copper, as well as a decrease in film hardness. The final copper grain sizes achieved according to embodiments of the invention are comparable to those obtained from a conventional furnace anneal. Furthermore, comparable grain size and sheet resistance results can be achieved using in-situ annealing either at about 250° C. for 30 seconds or at about 350° C. for 60 seconds. Annealing according to certain embodiments of the invention, e.g., at temperatures greater than about 200° C., also result in a decrease of film hardness by about 50% (e.g., to about 150 Hv), compared to the as-deposited value of about 300 Hv.

After in-situ annealing, the copper layer 412 may be cooled to a temperature below about 100° C., preferably below about 80° C., and most preferably below about 50° C., prior to subsequent processing such as chemical mechanical polishing (CMP). Since the annealed copper layer 412 has larger grains and reduced film hardness, the CMP removal rate of the annealed copper is increased compared to that of non-annealed copper. FIG. 8 illustrates results of the CMP removal rate for an electroplated copper layer annealed according to embodiments of the invention at different in-situ anneal temperatures. Although the CMP removal rate increases after annealing for about 30 to about 120 seconds at about 100° C., stabilization of the CMP removal rate is preferably achieved by annealing at temperatures greater than about 200° C. For example, the CMP removal rate increases by nearly 42%, or greater than about 40%, for in-situ annealing at about 200 to about 400° C. There is relatively little fluctuation in the CMP removal rate for annealing at temperatures above 200° C. Furthermore, the CMP removal rate of the annealed copper remains constant with time because of the stabilization of the copper layer 412 according to the embodiments of the invention. By preventing oxidation of the copper layer 412, contamination of the slurry during CMP can also be avoided. Thus, CMP can be performed with improved process reproducibility.

In general, annealing according to embodiments of the invention results in copper layers with improved characteristics such as microstructure stability, enhanced reflectivity and reduced resistivity. Typically, the resistivity of the fully annealed copper layer approaches that of the bulk resistivity of copper. Thus, the invention is an attractive alternative to conventional furnace or RTP annealing techniques, because it provides an annealing method with wide process margins at relatively low cost and high throughput.

Although several preferred embodiments which incorporate the teachings of the present invention have been shown and described in detail, those skilled in the art can readily devise many other varied embodiments that still incorporate these teachings.

What is claimed is:

1. A method for annealing a copper layer, comprising:
   forming the copper layer on a substrate by electroplating in a first chamber of an integrated processing system;
   rinsing the substrate in a cleaning station of the integrated processing system;
   treating the copper layer in a gas environment in a second chamber of the integrated processing system, wherein the gas environment comprises nitrogen ($N_2$) and hydrogen ($H_2$); and
   bringing the substrate in proximity to a cooling plate to cool the substrate to a temperature below about 100° C., wherein treating the copper layer and bringing the substrate in proximity to a cooling plate occur within the same chamber.

2. A method of annealing a copper layer, comprising:
   forming the copper layer on a substrate by electroplating in a first chamber of an integrated processing system;
   rinsing the substrate in a cleaning station of the integrated processing system;
   treating the copper layer in a gas environment at a temperature of between about 200 to about 500° C. for a time duration of less than about 5 minutes in a second chamber of the integrated processing system; wherein the gas environment comprises nitrogen ($N_2$) and hydrogen ($H_2$); and
   bringing the substrate in proximity to a cooling plate to cool the substrate to a temperature below about 100° C., wherein treating the copper layer and bringing the substrate in proximity to a cooling plate occur within the same chamber.

* * * * *

UNITED STATES PATENT AND TRADEMARK OFFICE
CERTIFICATE OF CORRECTION

PATENT NO. : 7,192,494 B2
APPLICATION NO. : 10/611589
DATED : March 20, 2007
INVENTOR(S) : Chen et al.

It is certified that error appears in the above-identified patent and that said Letters Patent is hereby corrected as shown below:

On The Title Pge (56) (pg 3)
Other Publications:

First Singer article, please delete "Pages cover, 91-91, 94, 96 & 98" and insert --Pages cover, 90-92, 94, 96 & 98--.

In the Specification:

In Column 1, Line 51, please delete "equipments" and insert --equipment--;

In Column 2, Line 58, please delete "that used" and insert --that was used--;

In Column 4, Line 13, please delete "202$c$" and insert --202$c$,--;

In Column 6, Line 32, please delete "preferably," and insert --preferably--.

Signed and Sealed this

Eleventh Day of September, 2007

JON W. DUDAS
*Director of the United States Patent and Trademark Office*